US005487792A

United States Patent [19]
King et al.

[11] Patent Number: 5,487,792
[45] Date of Patent: Jan. 30, 1996

[54] MOLECULAR ASSEMBLIES AS PROTECTIVE BARRIERS AND ADHESION PROMOTION INTERLAYER

[75] Inventors: David E. King, Lakewood; Alvin W. Czanderna, Denver; Cheryl E. Kennedy, Lafayette, all of Colo.

[73] Assignee: Midwest Research Institute, Kansas City, Mo.

[21] Appl. No.: 258,984

[22] Filed: Jun. 13, 1994

[51] Int. Cl.[6] .................. H01L 31/04; H01L 31/048; H01L 31/0216; H01L 31/0224
[52] U.S. Cl. .................. 136/256; 106/14.43; 136/259; 148/271; 427/337; 427/402; 427/404; 427/2; 359/514; 428/457
[58] Field of Search .................. 136/251, 256, 136/259; 106/14.43; 148/271; 427/337, 402, 404; 437/2–5; 359/514; 428/457

[56] References Cited

U.S. PATENT DOCUMENTS

| | | | |
|---|---|---|---|
| Re. 24,819 | 5/1960 | Murphy | 428/470 |
| 3,330,672 | 7/1967 | Kroll et al. | 106/3 |
| 3,346,405 | 10/1967 | Viventi | 106/14.41 |
| 3,518,098 | 6/1970 | Ford et al. | 106/3 |
| 3,649,373 | 3/1972 | Dahms | 148/271 |
| 3,682,786 | 8/1972 | Brown et al. | 205/50 |
| 4,057,439 | 11/1977 | Lindmayer | 136/251 |
| 4,093,473 | 6/1978 | Lindmayer | 136/251 |
| 4,249,958 | 2/1981 | Baudin et al. | 136/251 |
| 4,255,214 | 3/1981 | Workens | 148/269 |
| 4,343,660 | 8/1982 | Martin | 148/269 |
| 4,376,797 | 3/1983 | Howse | 427/302 |
| 4,426,240 | 1/1984 | Louis et al. | 156/99 |
| 4,499,658 | 2/1985 | Lewis | 437/2 |
| 4,636,578 | 1/1987 | Feinberg | 136/251 |
| 4,690,715 | 9/1987 | Allara et al. | 148/252 |
| 4,692,557 | 9/1987 | Samuelson et al. | 136/251 |
| 4,907,038 | 3/1990 | Shigehara et al. | 257/30 |
| 4,953,577 | 9/1990 | Marshall | 136/251 |
| 4,957,890 | 9/1990 | Wieserman et al. | 502/4 |
| 4,962,073 | 10/1990 | Martin et al. | 502/4 |
| 4,963,012 | 10/1990 | Tracy et al. | 359/514 |
| 4,983,566 | 1/1991 | Wieserman et al. | 502/111 |
| 5,053,293 | 10/1991 | Yamakita et al. | 429/111 |
| 5,344,498 | 9/1994 | Inoue | 136/251 |

OTHER PUBLICATIONS

M. K. Chaudhury and E. P. Plueddemann, "Bonding of Vapor Deposited Gold to Glass using Organosilane Primers," J. Adhesion Sci. Tech., 1(3): 243–246, (1987).
An Introduction to Ultrathin Organic Films, Abraham Ulman, AP. Inc., (1991), pp. 237–304.
Paul E. Laibinis and Goerge M. Whitesides, "Self–Assembled Monolayers of n–Alkanethiolates on Copper are Barrier Films that Protect the Metal against Oxidation by Air," J. Am. Chem. Soc., 114: 9022–9028, (1992).
Bryan Parker and Andrew J. Gellman, "Orientation and Chemistry of Alkyl Thiolates on the Ni(100) Surface," Surface Science, 292: 223–234, (1993).
Mino, et al., "Thin Film Characteristics of Fluorine–Substituted Monolayers Prepared by Chemical Adsorption from Solution," Thin Solid Films, 230: 209–216, (1993).
Yamamoto, et al., "Self–Assembled Layers of Alkanethiols on Copper for Protection Against Corrosion," J. Electrochem. Soc., 140(2): 436–443, (Feb. 1993).

*Primary Examiner*—Aaron Weisstuch
*Attorney, Agent, or Firm*—Edna M. O'Connor

[57] ABSTRACT

A protective diffusion barrier having adhesive qualifies for metalized surfaces is provided by a passivating agent having the formula $HS-(CH_2)_{11}-COOH$ Which forms a very dense, transparent organized molecular assembly or layer that is impervious to water, alkali, and other impurities and corrosive substances that typically attack metal surfaces.

12 Claims, 5 Drawing Sheets

MOLECULAR ASSEMBLIES AS PROTECTIVE BARRIERS AND ADHESION PROMOTION INTERLAYER

The United States Government has rights in this invention under Contract No. DEAC0283CH10093 between the U.S. Department of Energy and the National Renewable Energy Laboratory, a Division of Midwest Research Institute.

BACKGROUND OF THE INVENTION

1. Field of the Invention

The present invention relates to a method of protecting metalized surfaces from contamination and degradation due to environmental conditions and, more particularly, to a protective barrier which increases the adhesion qualities of a metalized surface for subsequent polymer casing.

2. Description of the Prior Art

The physical and chemical properties of metals have made metals useful in a variety of applications. Often, however, the use of one desirable property of a metal in a specific application may be precluded by other properties of the metal. For example, the collection of humidity and chemicals normally found in the atmosphere result in the corrosion or oxidation and degradation of exposed metal surfaces. Consequently, metals that are typically exposed to environmental conditions for prolonged periods of time require that a protective coating be applied to the exposed surface. However, the inert character of some metals reduces the ability to adhere protective coatings to metal surfaces.

Environmental degradation and adherent qualities of metals are of great concern in solar collector applications due to the utilization of mirrors and photovoltaic devices. Most commercial mirrors are silvered glass composite structures wherein a thin layer of silver is deposited on the surface of a glass substrate to reflect light. Silver is preferred because its reflectivity is significantly greater than other metals, although other metals can be used. A common commercial process for fabricating such mirrors is known as a wet chemical electroless process, wherein a thin layer of chemically reduced silver is precipitated onto a sensitized glass surface. In order to protect the silver layer from damage and degradation, a protective coating is applied to its exposed surface. A common protective coat comprises a copper electroless layer deposited over the silver layer, with a thick enamel paint spread over the copper layer. The copper layer interposed between the silver and paint layers enhances adhesion of the paint to the silver. A typical composite silvered glass mirror structure is shown in FIG. 1.

Silvered glass mirror structures as described above have been used indoors without significant problems for many years. The more recent interest in the use of mirrors for solar collector applications, such as heliostats, has resulted in more outdoor test installations of mirrors. While such tests have indicated economic feasibility of mirrored solar collector concepts from an energy standpoint, they also revealed that conventional silvered glass mirrors do not stand up very well in outdoor environments. In fact, the reflective properties of most conventional mirrors undergo substantial degradation of their reflective properties within several months to several years in outdoor environments, which is a relatively short time when a useful life of 20 years is generally considered to be a minimum design requirement for economical solar collector installations.

Photovoltaic devices or solar cells used in solar collector applications suffer from the same drawbacks that confront the outdoor use of mirrors. Solar cells have two electrodes, a metal layer affixed to a substrate and metalized grid lines on the surface opposite the metal layer of the substrate. These metal surfaces, much like silvered surface of mirrors, are also prone to environmental degradation and contamination.

Accordingly, there have been many attempts to extend both the lives of mirrors, solar cells and metal surfaces, in general, by applying protective barrier layers to the metal or by encasing the entire devices in water resistant and weather impervious encapsulants. The technical papers by Yamamoto et al. and Laibinis et al. entitled "Self-Assembled Layer of Alkanethiols on Copper for Protection Against Corrosion" J. Electrochem. Soc., 140:2, 436–443 (1993) and "Self-Assembled Monolayers of n-Alkanethiolates on Copper Are Barrier Films that Protect the Metal against Oxidation by Air", J. Am. Chem. Soc. 114: 9022–9028 (1992), respectively, report that n-alkanethiolates adsorb from solution onto copper surfaces thereby forming densely packed self-assembled monolayers that slow the oxidation of the copper surface by reaction with atmospheric dioxygen. Viventi in his U.S. Pat. No. 3,346,405 discloses the use of a silicon-bonded mercaptoalkyl radical as the active ingredient for protecting silver and copper surfaces from corrosion and attendant discoloration. U.S. Pat. No. 3,649,373 issued to Dahms describes the use of attaching various small organic thiol compounds containing aromatic rings through a sulfur/metal bond to silver surfaces for the passivation of metal surfaces that are exposed to elevated temperatures. U.S. Pat. No. Re. 24,819, issued to Murphy, discloses a polishing composition that contains long-chain alkane thiols in combination with mild polishing agents designed to clean and passivate the surface of silver articles. Tracy et al.in their U.S. Pat. No. 4,963,012 discloses the use of silicon nitride as a protective diffusion barrier for metalized mirror structures. While Workens, in his U.S. Pat. No. 4,255,214 discloses the use of a 0.25% or more solution of tolytriazole as a protective layer for the prevention of oxidative degradation of the silver and/or copper films of a mirror.

In order to provide adequate protection against degradation of the photovoltaic cells by corrosion of the electrodes, caused by potentially harmful ambient conditions Marshall in his U.S. Pat. 4,953,577 discloses a method of encapsulating a photovoltaic device in a two component fluorinated polyurethane material with 3-glycidoxy propyltrimethoxy silane. While Baudin et al., U.S. Pat. No. 4,249,958, discloses a method of manufacturing a panel comprising at least one photovoltaic cell located between a transparent sheet and a second sheet adhered together using an adhesive, polyvinyl butyryl. Louis et al. discloses adhesive compositions that contain organopolysiloxanes having SiC-bonded vinyl groups and Si-bonded hydrogen to be used for bonding laminated glass and for gluing silicon semiconductor elements onto substrates in manufacturing solar cells.

The above technical papers by Yamamoto et al. and Laibinis et al. and U.S. Patents issued to Murphy disclose the adsorbance of n-alkanethiolates to metal surfaces thereby protecting the metal surface from oxidative reactions with the environment. A disadvantage of these approaches is that the adhesive characteristics of the metal are unaffected. Consequently, while n-alkanethiols may provide protective barriers for the metal's surface they do not enhance the adherent characteristics of the metal. Therefore, n-alkanethiols are not ideal candidates in applications which require both protective and adhesive qualities. Furthermore, the abrasives present in Murphy's composition will interfere with the formation of a pin hole free molecular monolayer.

While Marshall and Baudin et al. disclose methods of protecting photovoltaic devices from degradation as a result of exposure to environmental conditions using encapsulating materials, a disadvantage is that the grid lines of the photovoltaic device are not adequately protected from environmental reaction and migration of reaction products into the encapsulants matrices. Consequently, the efficiency of the grid line as a conductor over time decreases due to corrosion build-up.

There is still a need, therefore, for a single passivating agent that possesses the ability to act not only as a protective barrier to a metal surface but also acts to increase the adhesive characteristics of the metal surface.

SUMMARY OF THE INVENTION

Accordingly, it is an object of the present invention to provide a novel passivating agent having adhesive qualities for metal surfaces to repel any outside humid, contaminating, or corrosive environment.

It is also an object of the present invention to provide a novel passivating agent having adhesive qualities for laminated layers of a mirror structure to repel any outside humid, contaminating or corrosive environment.

Another object of the present invention is to provide a passivating agent having adhesive qualities around the electrodes of a photovoltaic device thereby to protect the integrity of the electrodes from deleterious chemical degradation.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described therein, the method of this invention may comprise applying a passivating agent typically of the formula $HS-(CH_2)_n-R$, wherein n=11 or greater and R being a carboxylic acid, or other functional group applied to a metal surface to form a diffusion barrier that is impervious to water and corrosive environment and that is adhesive with a subsequent layer of protective coatings.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the Drawings

DETAILED DESCRIPTION OF THE PREFERRED EMBODIMENTS

Figure 1:
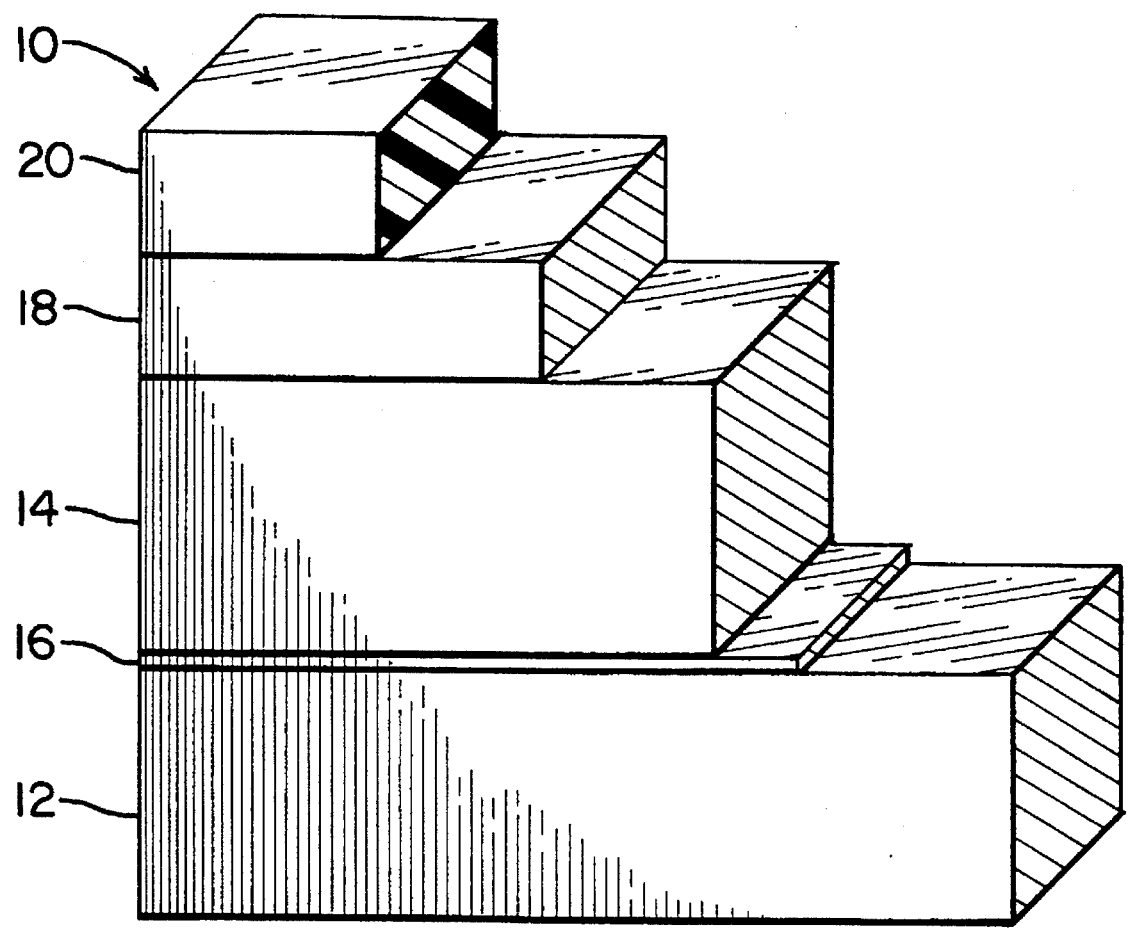
FIG. 1 is a perspective diagrammatic block view of the structure of a conventional silver glass mirror constructed according to a common wet chemical electroless process.

A typical mirror structure 10 constructed according to the conventional wet chemical electroless process is illustrated in FIG. 1. It is a composite structure comprising a glass substrate 12 with a layer of silver (Ag) 14 coated on the glass surface. A sensitizer 16, usually consisting of a tin chloride, water, and hydrochloric acid solution, is deposited on the surface of the glass substrate 12 prior to the silver to enhance adhesion of the silver layer 14 to the glass substrate 12. A paint layer 20 is coated over the mirror in an attempt to protect the mirror from the environment. However, paint layer 20 does not adhere very well to the silver layer 14. Therefore, a thin copper (Cu) layer 18 is first deposited on the silver layer 14, and the paint layer 20 is coated over the copper layer 18. The copper layer 18 also shields the silver layer 14 to some extent from the deleterious chemical degradation of the silver that could otherwise result from the ingredients and impurities in the paint layer 20.

The substantial degradation of mirror structure 10 in outdoor environments, as discussed above, shows that the paint 20 and copper 18 layers do not provide sufficient protection.

The method of protecting metal surfaces according to this invention provides a much superior coating for the silver layer of mirrors. This passivating agent has the general formula $HS-(CH_2)_n-R$, wherein n in the formula is an integer of 11 or greater while R in the formula is a carboxylic acid, triflouride, methyl, alcohol, cyanide, ester, phenyl, amide or other functional organic group. In the preferred embodiment the passivating agent 28, shown schematically in FIG. 2, has the formula $HS(CH_2)_{11}-COOH$, which forms a very dense, impermeable, and adhesive material. In fact, when a metal is submersed in a solution containing the passivating agent 28 a protective barrier or organized molecular assemblies spontaneously form on the metal's surface. The passivating agent 28 comprises a head group 30 or sulfur group which chemically bonds to the surface of the metal. The alkyl chains 32 form an axis substantially perpendicular to the metal's surface, leaving the terminal end 34 free to interact with the environment. The alkyl chains 32 of the passivating agent 28 interact with one another by van der Waals forces 33 thereby forming strong, coherent, and chemically stable monolayers dense enough not only to prevent permeation by water vapor but also to act as a diffusion barrier to many ions, including the alkalis which attack the silver and the silver-to-glass bond. The terminal end 34 has been engineered or "can be chosen" to increase the adhesive qualities of the passivating agent 28.

A coating of passivating agents 28 or an organized molecular assembly on mirrors is advantageous in that it can be applied over the silver layer to encapsulate and hermetically seal the silver layer with the glass substrate.

Figure 2:
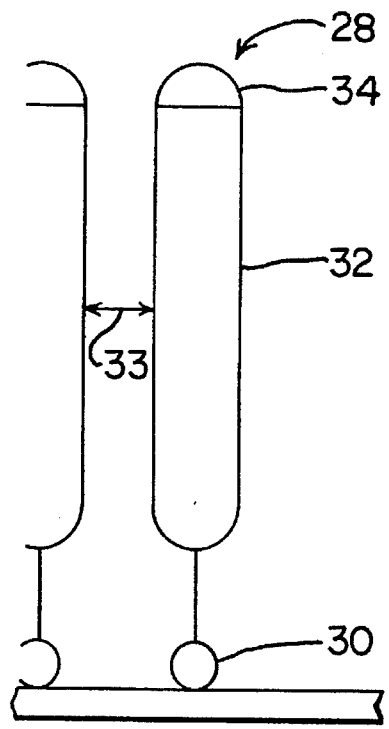
FIG. 2 is a schematic view of the passivating agent bonded to a metal surface and a view of the electrostatic interactions.
Figure 3:
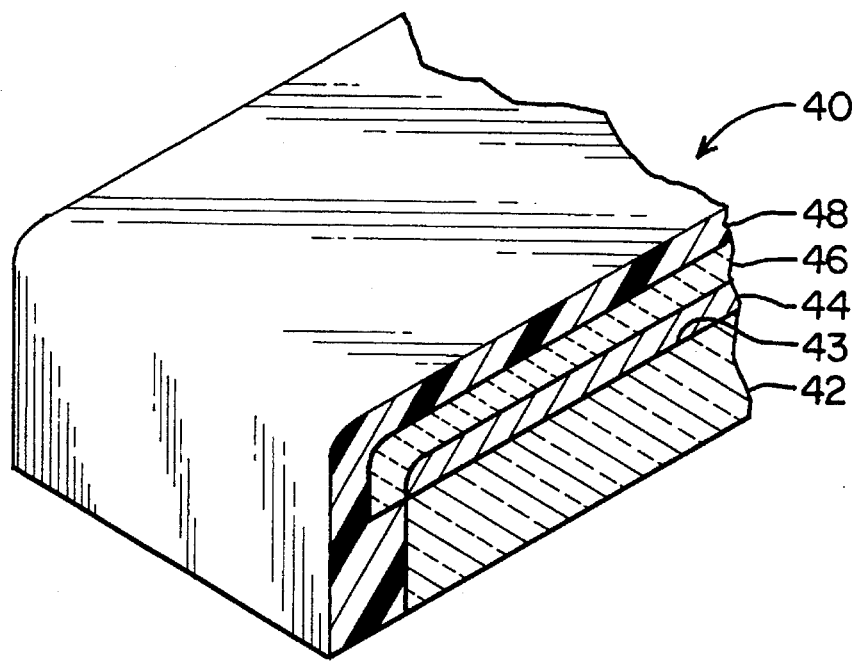
FIG. 3 is an enlarged cross-sectional view in perspective showing a mirror constructed with a protective adhesive barrier according to this invention.

The mirror structure 40 illustrated in FIG. 3 is an example of the use of the passivating agent 28 to cover and encapsulate a metal surface, such as silver layer 44 with a glass substrate 42. As shown therein, the glass substrate 42 has deposited thereon a layer of silver 44 by the conventional wet chemical electroless process. A sensitizer (not shown) is applied to the silver/glass interface 43 in this process, as described above and shown in FIG. 1. The organized molecular assembly 46 is then formed, as shown in FIG. 2, over the silver layer 44 and around the edges to hermetically seal the silver layer 44 and silver/glass interface 43 from the exterior environment. The formation of the organized molecular assembly 46 may be achieved by submersing the silver layer 44 and glass substrate 42 into a solution containing passivating agent 28 or by spraying the same over the surface of the silver layer 44. A paint coat 48 can then be spread over the organized molecular assembly 46, if desired.

The organized molecular assembly 46 in this structure provides a protective barrier to permeation of water vapor and other impurities from and through the paint coat 48 to the silver layer 44 and into the silver/glass interface 43. Thus, degradation caused by these external substances is effectively inhibited. Furthermore, the carboxylic acid group at the terminal end 34 of the organized molecular assembly 46 increases the adhesive qualities of the organized molecular assembly 46 thus eliminating the need of a copper layer.

Figure 4:
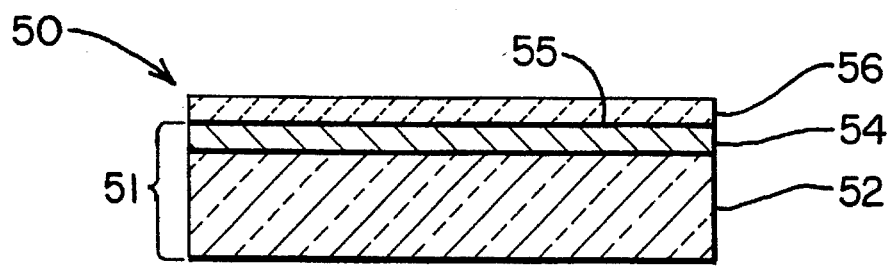
FIG. 4 is an enlarged, cross-sectional view of a thin sheet mirror structure having a PET substrate coated with silver that is passivated with a protective barrier according to this invention.

The second embodiment of this invention is shown in FIG. 4 wherein the organized molecular assembly 56 is applied to a thin sheet mirror 51 fabricated of flexible thin sheets or membrane substrates. The mirror 50 comprises a polymer plastic sheet 52 such as PET with a silver layer 54, about 1000 Å thick, deposited thereon. The thin sheet mirror 51 may be immersed in a solution of the passivating agent 28 and the organized molecular assembly 56 will spontaneously form on the surface 55 of silver layer 54.

Figure 5:
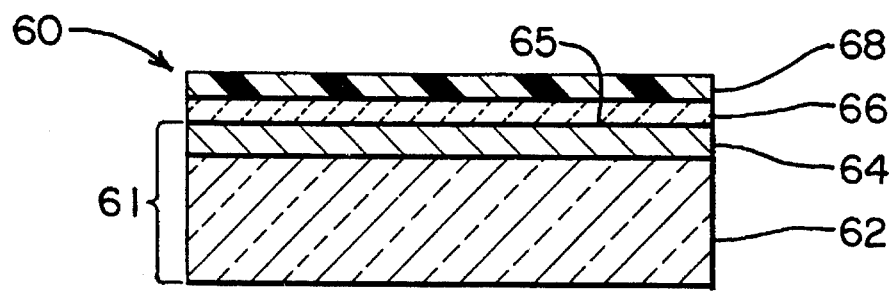
FIG. 5 is a structure similar to that shown in FIG. 4 and also including a PMMA protective polymer overlay coating.

The third embodiment 60, shown in FIG. 5, provides for an additional polymer layer or substrate 68 such as PMMA being deposited, using a spin, roll or dip technique, all of which are known by those skilled in the art, over the organized molecular assembly 66. Protective passivating agent coating 66 is applied to a thin sheet mirror 61 fabricated of flexible thin sheets. The mirror 60 comprises a polymer plastic sheet 62, such as PET, with a silver layer 64 deposited thereon. Normally, a polymer such as PMMA would not adhere to silver surface 65; however, the organized molecular assembly 66 has increased adhesive qualities due to the carboxylic acid terminus.

It is also significant that the protective passivating agent 28 provide significant protection so that the paint coating can be eliminated. Therefore, as shown in FIG. 4, this structure can be used as a front surface mirror, which provides improved reflection and other optical properties not inhibited by transmission of the light through the polymer substrate 52.

Figure 6:
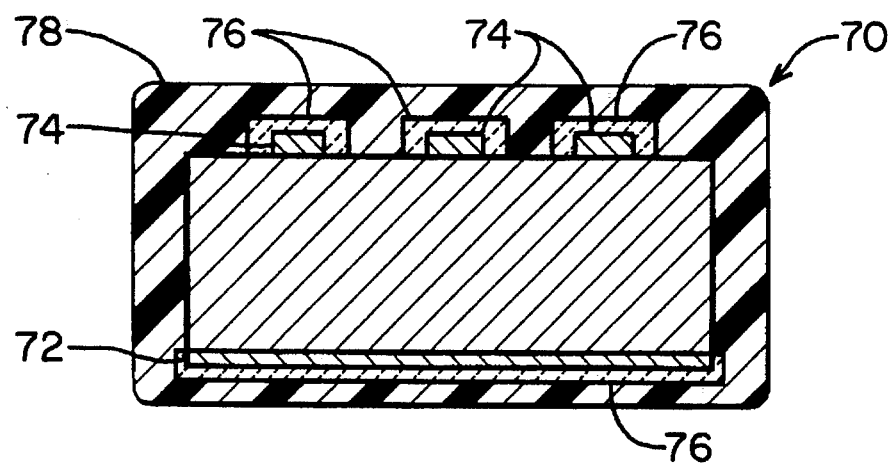
FIG. 6 is an enlarged, cross-sectional view of an encapsulated photovoltaic solar cell having the electrodes coated with a protective passivating agent.

The foregoing is considered as illustrative only of the principles of the invention. For example, while this description and the explanation herein refer to silver mirrors, it should be understood that the structure and processes of this invention is equally applicable to other metalized surfaces that may be subject to degradation due to environmental exposure. For example, a forth embodiment, shown in FIG. 6, illustrates a cross-sectional view of a photovoltaic cell 70 having back electrode 72 and light incident metal grid lines 74 encapsulated with an organized molecular assembly 76 prior to being encapsulated with polymer 78. While polymer 78 is intended to protect grid lines 74 and electrode 72 from harsh environmental conditions, migration or leaching of alkali and water vapor through the polymer 78 to the grid lines 74 and electrode 72 where corrosion and other deleterious chemical changes occur can destroy the efficiency of conductivity and thus the efficiency of the cell 70 itself. The organized molecular assembly 76 forms a protective barrier around the grid lines 74 and electrode 72.

EXAMPLES

The following examples demonstrate the efficacy of using a passivating agent having the general formula $HS-(CH_2)_n-COOH$ wherein n is an integer of 11 or greater, as a diffusion barrier for metal surfaces that is not only impenetrable but also has adhesive qualities.

The metal surfaces used as controls and starting materials for all subsequently protected metals employed in the following examples were thin mirror structures, each comprising a substrate material being polyethylene terephtalate (PET) having a silver layer evenly deposited over the surface of the substrate, referred to in the following examples as Ag/PET mirrors. The silver layer was vacuum deposited by a magnetron sputter system, sputtered at 1 Amp, 440V at 3 millitorrs of Argon, using a VAC-TEC Systems, Inc. Planar Magnetron model No. 79-141. The silver layer having a thickness of about 1000 Å. Immediately following deposition of the silver layer, the thin mirrors were removed from the vacuum chamber and immersed in a previously prepared 5 mM solution of $SH(CH_2)_{11}COOH$ in ethanol overnight. Other thin mirrors were immersed in a previously prepared 5 mM solution of $SH-(CH_2)_{11}CH_3$ in ethanol for overnight. The passivating agent spontaneously bonds to the metal surface, forming an organized molecular assembly (OMA) that coats the metal surface. The protected thin mirrors are removed from solution and rinsed in ethanol, then water and again in ethanol. The protected thin mirrors are then passed through a stream of nitrogen to dry the mirrors completely. These mirrors will be referred to in later examples as OMA/Ag/PET mirrors.

Subsequent to being dried, some of the thin mirrors that were immersed in the 5mM solution of $SH-(CH_2)_{11}COOH$ were further protected by applying a 1600 ppm (parts per million) solution of poly methyl methacrylate (PMMA) in methylethyl ketone (MEK) over the protective barrier formed by the passivating agent using a spin coating technique. In the later examples this structure will be referred to as PMMA/OMA/silver/PET mirror. The last structure that was constructed comprises an unprotected thin mirror having a PMMA material deposited thereon, as discussed previously, and will be referred to as a PMMA/silver/PET minor.

Accelerated weathering tests were performed using a weather-ometer (WOM), manufactured by Atlas Electric Company, having a xenon arc lamp with filters to match the silver spectrum, run at 60° C., 80% relative humidity. The tape pull test was performed on an Instron Co. Instruments and Systems for Advanced Material Testing, Model No. 1120 at a speed of 2 in/min, in a 90° peel configuration and a peel force read in percents of five kilograms (% of 5 kg) were recorded.

Example I (Ag/PET v. OMA/Ag/PET)

Figure 7:
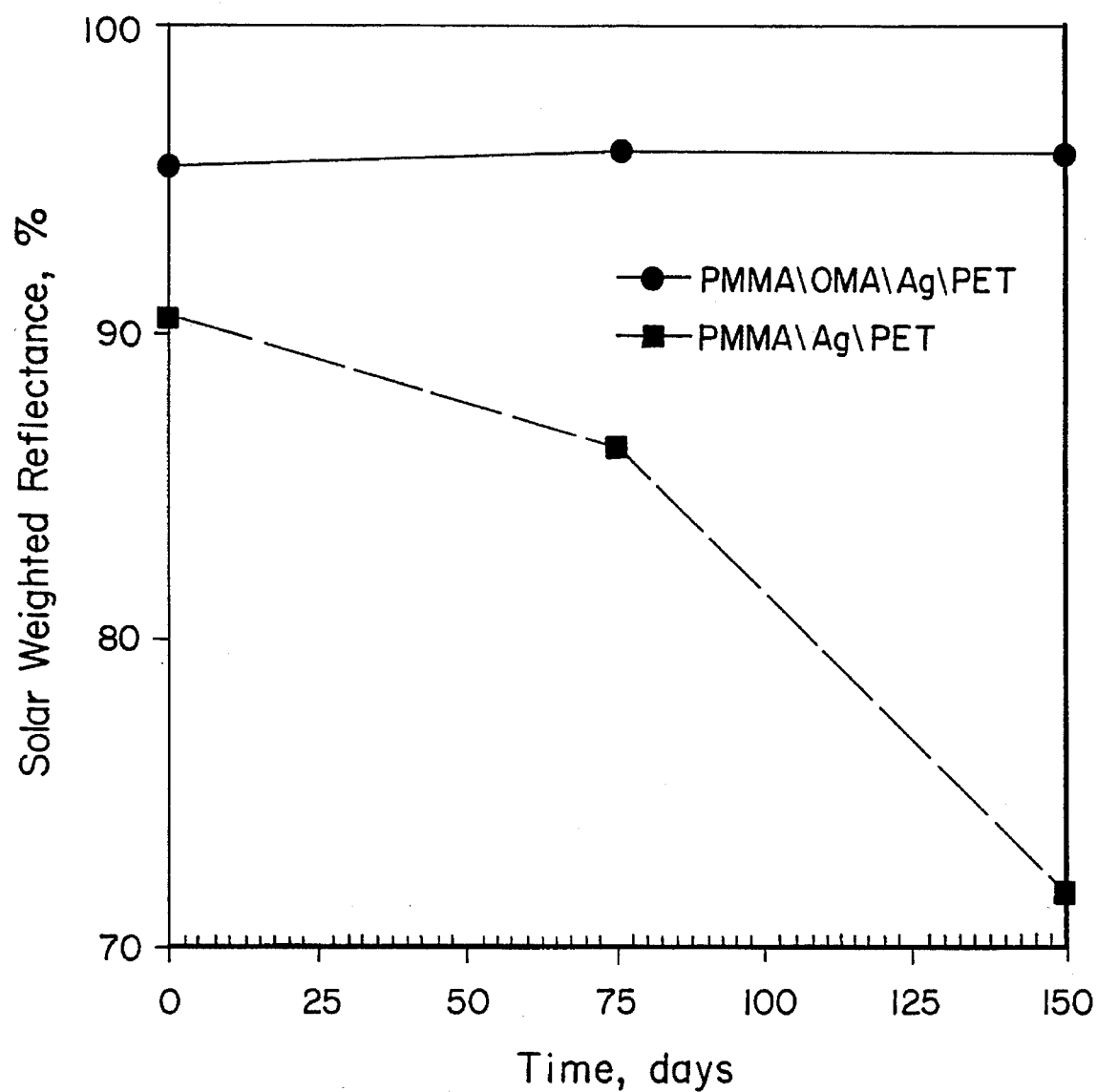
FIG. 7 is a graphic illustration comparing the degradation of silver mirrors, protected and unprotected, subjected to accelerated weather testing.

A. Accelerated weathering tests were performed on both protected and unprotected Ag/PET silver mirrors. The solar weighted reflectance was measured for each structure over a period of time that is equivalent to five months. The protected silver mirror or PMMA/OMA/Ag/PET maintained an approximately 96.9% solar weighted reflectance while the solar weighted reflectance of the unprotected silver mirror or PMMA/Ag/PET was approximately 71% after five months showing substantial degradation of the silver surface due to indoor ambient conditions. See FIG. 7.

Figure 8:
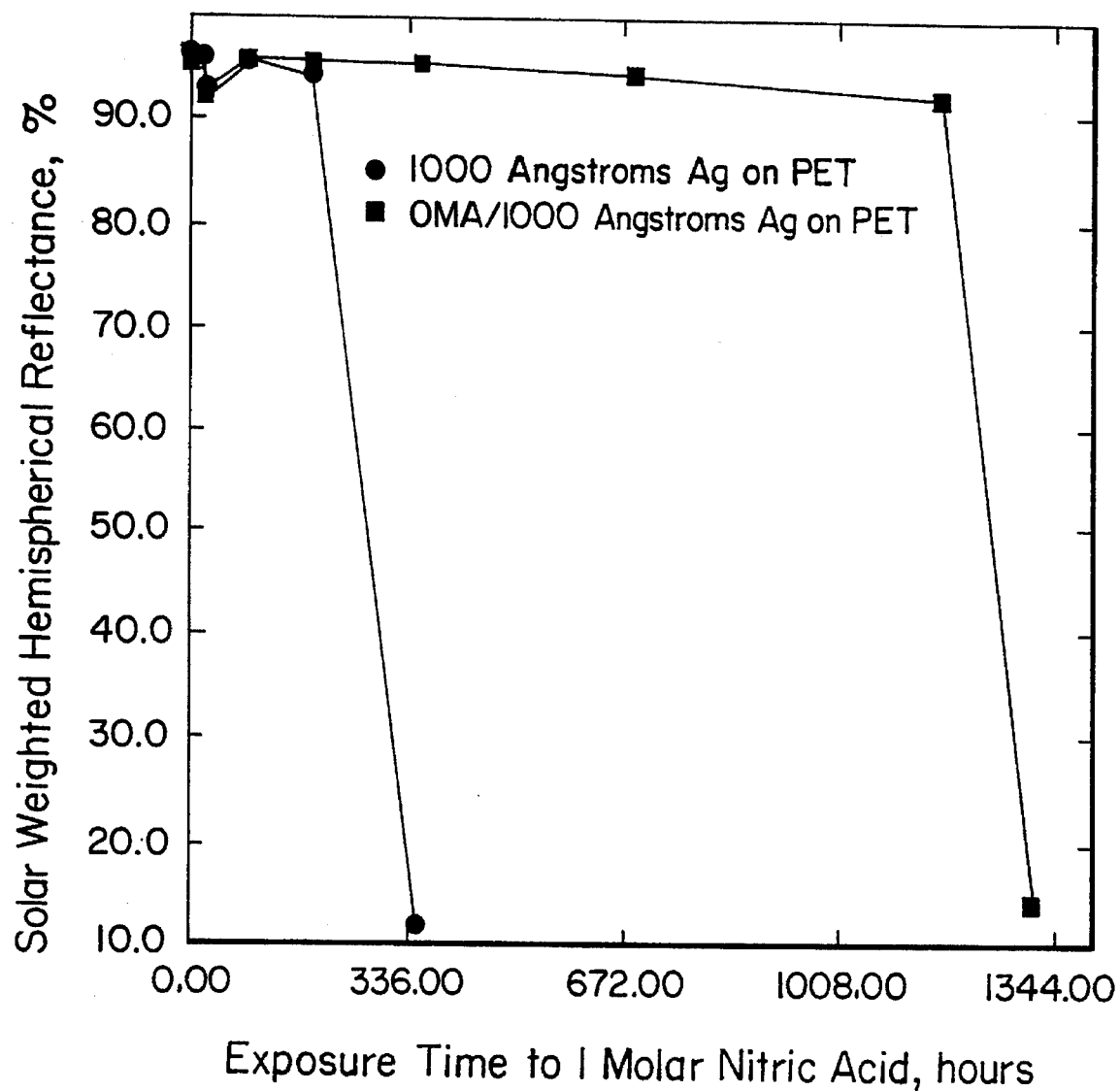
FIG. 8 is a graphic illustration comparing the degradation of silver mirrors, protected and unprotected, subjected to 1M nitric acid.

B. Protected and unprotected Ag/PET silver mirrors were exposed to 1 molar nitric acid and the solar weighted reflectance was measured for each structure over a period of time. As is graphically depicted in FIG. 8 the nitric acid began to degrade the silver surface and thus effect the solar weighted reflectance of the Ag/PET mirror after approximately 170 hours. Once the degradation began, it continued at a rapid pace resulting in a 10% solar weighted reflectance after 336 hours. The protected silver mirror or OMA/Ag/PET mirror maintained its integrity for approximately 1,176 hours or seven times that of the unprotected mirror. However, once the integrity of the protective barrier or organized molecular assembly was breached degradation occurred at the same rate as that of the unprotected mirror.

Example II (PMMA/OMA/Ag/PET v. PMMA/Ag/PET)

A. Accelerated weathering tests were performed on both the PMMA/OMA/Ag/PET mirror and on the PMMA/Ag/PET mirror. PMMA is a polymer that is used to protect silver layers, however, PMMA does not adhere well to silver. Therefore, as the PMMA begins to degrade and peel back from the silver the solar weighted reflectance decreases. As demonstrated in Table I below the PMMA adhered to the protected mirror or PMMA/OMA/Ag/PET thus resulting in little degradation as observed by the little decrease in the solar weighted reflectance.

TABLE I

| Sample | Solar Weighted Reflectance | Average |
|---|---|---|
| 1. without OMA | 87.62 | 86 |
| 2. without OMA | 84.89 | |
| 3. with OMA | 96.00 | 96 |
| 4. with OMA | 96.33 | |
| 5. with OMA | 96.08 | |
| 6. with OMA | 95.33 | |
| 7. Bare Silver Vacuum Deposited | 97.00 | Prior to weathering |

Example III (Ag/PET v. OMA-COOH/Ag/PET v. OMA-CH$_3$/Ag/PET)

A. Tape pull tests as described above were performed on the following mirrors: The Ag/PET mirror was the control, an Ag/PET mirror protected with a passivating agent having a carboxylic acid at the terminal end and an Ag/PET mirror protected with a passivating agent having a methyl terminus. As demonstrated in Table 2 below, the passivating agent having a carboxylic acid terminus provided a 23% stronger surface bond than the control.

TABLE II

| Sample | % of 5 Kg | Average |
|---|---|---|
| OMA with CH$_3$ terminus | 0 | |
| OMA with CH$_3$ terminus | 0 | |

TABLE II-continued

| Sample | % of 5 Kg | Average |
|---|---|---|
| OMA with COOH terminus | 0.39 | 0.43 |
| OMA with COOH terminus | 0.46 | |
| Ag/PET (Bare Silver) | 0.37 | 0.35 |
| Ag/PET (Bare Silver) | 0.33 | |

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The embodiments of the invention in which an exclusive property or privilege is claimed are defined as follows:

1. An article having a metal surface, comprising:
   a diffusion barrier comprising an agent having the general formula HS—(CH$_2$)$_{11}$—COOH deposited on said metal surface.

2. The article of claim 1, wherein said metal surface comprises a silver layer.

3. The article of claim 2, wherein said article further comprises said silver layer being deposited over a substrate thereby sandwiching said silver layer between said diffusion barrier and said substrate.

4. The article of claim 1, wherein said article is a mirror.

5. The article of claim 1, wherein said article is a photovoltaic cell.

6. The article of claim 5, wherein said metal surface comprises the light-incident electrodes of said photovoltaic cells.

7. A mirror, comprising:
   a substrate;
   a reflective layer of metal deposited on said substrate; and
   a diffusion barrier comprising a passivating agent having the formula HS—(CH$_2$)$_{11}$—COOH adsorbed to said reflective layer such that said reflective layer is encapsulated by said substrate and said diffusion barrier.

8. A photovoltaic device, comprising:
   light-incident electrodes; and
   a diffusion barrier comprising a passivating agent having the formula HS—(CH$_2$)$_{11}$—COOH adsorbed to said electrodes.

9. A method for fabricating a long-lasting mirror capable of long-term use as an effective reflector in solar collector applications, said method comprising the steps of:
   depositing a planarizing reflective layer of metal on the surface of a substrate; and
   coating said reflective layer with a diffusion barrier wherein said diffusion barrier has the formula HS—(CH$_2$)$_{11}$—COOH.

10. The method of claim 9, wherein said reflective layer of metal comprises silver.

11. The method of claim 9, wherein said substrate comprises a thin, flexible polymer sheet.

12. A method for fabricating a long-lasting photovoltaic solar cell capable of longterm use as an efficient energy producer in solar collector applications, said method comprising the steps of:
   coating the light incident electrodes of the photovoltaic solar cell with a diffusion barrier wherein said diffusion barrier has the formula HS—(CH$_2$)$_{11}$—COOH.

* * * * *